United States Patent [19]
Omori et al.

[11] Patent Number: 5,266,389
[45] Date of Patent: * Nov. 30, 1993

[54] SURFACE-COATED HARD MATERIAL FOR CUTTING TOOLS OR WEAR RESISTANCE TOOLS

[75] Inventors: Naoya Omori; Kazuo Yamagata; Toshio Nomura; Masaaki Tobioka, all of Itami, Japan

[73] Assignee: Sumitomo Electric Industries, Ltd., Osaka, Japan

[*] Notice: The portion of the term of this patent subsequent to Jun. 27, 2009 has been disclaimed.

[21] Appl. No.: 691,020
[22] PCT Filed: Sep. 28, 1990
[86] PCT No.: PCT/JP90/01258
  § 371 Date: Jun. 27, 1991
  § 102(e) Date: Jun. 27, 1991
[87] PCT Pub. No.: WO91/05076
  PCT Pub. Date: Apr. 18, 1991

[30] Foreign Application Priority Data

Sep. 29, 1989 [JP] Japan .................. 1-254492
May 15, 1990 [JP] Japan .................. 2-125152
Sep. 5, 1990 [JP] Japan .................. 2-119191

[51] Int. Cl.⁵ .................................. C23C 14/06
[52] U.S. Cl. .................... 428/216; 428/698; 428/704; 51/295; 51/307; 51/309
[58] Field of Search ........... 428/698, 216, 336, 704; 51/295, 307, 309

[56] References Cited

U.S. PATENT DOCUMENTS

| | | | |
|---|---|---|---|
| 4,237,184 | 12/1980 | Gonseth et al. | 428/336 |
| 4,525,415 | 6/1985 | Porat | 428/216 |
| 4,539,251 | 9/1985 | Sugisawa et al. | 428/216 |
| 4,540,596 | 9/1985 | Nimmagadda | 429/39 |
| 4,599,281 | 7/1986 | Schintlmeister et al. | 428/698 |
| 4,643,951 | 2/1987 | Keem et al. | 428/698 |
| 4,675,206 | 6/1987 | Ikegaya et al. | 427/38 |
| 4,753,854 | 8/1988 | Gavrilov et al. | 428/698 |
| 4,776,863 | 10/1988 | van denBerg et al. | 51/307 |

FOREIGN PATENT DOCUMENTS

| | | |
|---|---|---|
| 0247630 | 12/1987 | European Pat. Off. |
| 60-25605 | 2/1985 | Japan |
| 2110246 | 6/1983 | United Kingdom |
| 2182060 | 5/1987 | United Kingdom |
| 2192196 | 1/1988 | United Kingdom |

OTHER PUBLICATIONS

Schintlmeister et al, "Cutting Tool Material Coated by Chemical Vapour Deposition" Wear, 100 (1984) pp. 153-169.

Beensh-Marchwicka et al, "Structure of Thin Films Prepared by the Lospultoning of Titanium and Aiuminum or Titanium and Silicon" Thin Solid Films, 82 (1981) pp. 313-320.

*Primary Examiner*—A. A. Turner
*Attorney, Agent, or Firm*—Wenderoth, Lind & Ponack

[57] ABSTRACT

A surface-coated hard material for a cutting tool or wear resistance tool is provided which is excellent in wear resistance, deposition resistance and breakage resistance and exhibits good cutting performances for a long time, as a cutting tool or a wear resistance tool, in not only a low speed cutting but also a high speed cutting, and in which a layer consisting of a carbide, nitride or carbonitride of Ti, Zr or Hf and a layer consisting of a carbide, nitride or carbonitride of Al are alternately laminated to form at least 10 hard coating layers.

1 Claim, No Drawings

SURFACE-COATED HARD MATERIAL FOR CUTTING TOOLS OR WEAR RESISTANCE TOOLS

TECHNICAL FIELD OF THE INVENTION

This invention relates to a surface-coated hard material for cutting tools or wear resistance tools, in which a coating layer is provided on the surface of a cutting tool or wear resistance tool to improve the wear resistance.

TECHNICAL BACKGROUND

Up to the present time, cutting tools and wear resistance tools have generally been composed of cemented carbides based on tungsten carbide (WC), various cermets based on titanium carbide (TiC), steels such as high-speed steels or hard alloys and ceramics based on silicon carbide and silicon nitride.

In order to improve the wear resistnace of the cutting tools or wear resistance tools, a surface-coated hard material has been developed and has lately been put to practical use, in which one or more layers of carbides, nitrides or carbonitrides of Ti, Hf or Zr or oxide of Al are formed on the whole surface or the surface of the edge part thereof by a PVD method or CVD method. In particular, the cutting tool or wear resistance tool having the hard coating layer formed by the PVD method is capable of improving the wear resistnce without deteriorating the strength of the base material and accordingly, it is suitable for a cutting use requiring strength, for example, throwaway inserts for drills, end mills, milling cutters, etc.

However, the PVD method is favorably compared with the CVD method in respect that the hard coating layer can be formed without deteriorating the strength of the substrate. But, in the PVD method, it is difficult to stably form an oxide of Al and accordingly, a hard coating layer consisting of Al oxide formed by the PVD method has not been put to practical use. On the other hand, in the hard coating layers consisting of carbides, nitrides or carbonitrides of Ti, Hf or Zr formed by the present PVD method, the wear resistance cannot be said sufficient and in the high speed cutting, in particular, cutting tools or wear resistance tools thereof have shortened lives because of poor wear resistance.

DISCLOSURE OF THE INVENTION

Under the situation, the present invention has been made for the purpose of overcoming the disadvantages of the prior art and thus provides a surface-coated hard material for a cutting tool or wear resistance tool by providing a coating layer having excellent wear reisistance while maintaining the substrate strength of the cutting tool or wear resistance tool, in particular, exhibiting an improved wear resistance over the prior art in high speed cutting.

The above described object can be achieved by a surface-coated hard material for a cutting tool or wear resistance tool, characterized in that a layer consisting of a carbide, nitride or carbonitride of Ti, Zr or Hf and a layer consisting of a carbide, nitride or carbonitride of Al are alternately laminated to form at least 10 hard coating layers, each layer having a thickness of 0.01 to 0.2 $\mu$m and the total layer thickness being 0.5 to 10 $\mu$, on the surface of a substrate of a cutting tool or wear resistance tool. In a preferred embodiment of the present invention, at least 10 layers of TiN layers and AlN layers each having a thickness of 0.01 to 0.2 $\mu$m are alternately laminated to provide a coating layer having a whole layer thickness of 0.5 to 0.8 $\mu$m on the surface of a substrate consisting of a cutting tool or wear resistance tool, thus obtaining a surface-coated super-hard material for a cutting tool or wear resistance tool.

In the present specification, Ti, Zr and Hf are sometimes represented by M.

The hard coating layer can be provided on the whole surface of a cutting tool or wear resistance tool or only the surface of an edge part. Formation of the hard coating layer can be carried out in known manner, but the PVD method such as sputtering methods, ion plating methods, etc. is preferable in respect of that the substrate strength can readily be maintained.

The surface-coated super-hard material of the present invention is excellent, as a cutting tool or wear resistance tool, in wear resistance, deposition resistance and breakage resistance and exhibits an excellent cutting performance for a long period of time in not only low speed cutting but also high speed cutting.

The reason therefor is that when a thin TiN layer and AlN layer are alternately laminated on the surface of a substrate, for example, TiN increases the hardness of the coating layer and simultaneously improves the adhesiveness thereof to the substrate, while AlN improves the breakage resistance and renders the crystals of TiN finer. That is, it is considered that the TiN layer and AlN layer are synergetically reacted to form a coating layer having, as a whole, excellent wear resistance, deposition resistance and breakage resistance.

As described above, in the surface-coated hard material of the present invention, the hard coating layer is composed of thin layers of MC, MN or MCN and thin layers of ALC, AlN or ALCN, laminated alternately, so when using it as a cutting tool or wear resistance tool, there can be obtained an excellent wear resistance, deposition resistance and breakage resistance, and good cutting performance can be maintained for a long time.

That is, in each layer of the hard coating multilayer, an M carbide, nitride or carbonitride not only increases the bonding strength to the substrate, but also raises the hardness of the hard coating layer. And, on the other hand, Al carbide, nitride or carbonitride improves the breakage resistance of the hard coating layer and simultaneously, is dissolved in the layer of Hf carbide, nitride or carbonitride to render the crystal grains finer. Therefore, the wear resistance, deposition resistance and breakage resistance of the hard coating layer, as a whole, are improved by the synergistic action of these laminated layers.

Furthermore, it is found that the surface-coated hard material as a cutting tool or wear resistance tool provided with the above described hard coating layer exhibits a good wear resistance even in the high speed cutting because of formation of Al$_2$O$_3$ having a very high hardness at a high temperature even in a very small amount in the hard coating layer due to rising of the edge temperature during cutting.

As to the thickness of the hard coating layer, if the whole layer thickness is less than 0.5 $\mu$m, the wear resistance is hardly improved, while if more than 10 $\mu$m, the residual stress is so large that the bonding strength to a substrate is lowered. Accordingly, the whole layer thickness should be in the range of 0.5 to 10 $\mu$m.

The layer thickness of each of layers consisting of carbides, nitrides or carbonitrides of M and layers consisting of carbides, nitrides or carbonitrides of Al, to be laminated alternately, should be in the range of 0.01 to 0.2 μm, since it is difficult to form a layer with a thickness of less than 0.01 μm and if the thickness is less than 0.0 μm, the whole hard coating layers laminated are too brittle to maintain the wear resistance, while if more than 0.2 μm, formation of solid solutions does not take place between the layers because of the larger thickness thereof and improvement of the wear resistance, deposition resistance and breakage resistance by the synergistic reaction can not be obtained. Furthermore, even if the thickness of the each layer is in the range of 0.01 to 0.2 μm, it is difficult to compose a hard coating layer having, as a whole, an excellent wear resistance, deposition resistance and brekage resistance in a case where the number of the layers laminated alternately is less than 10 layers.

The present invention will be illustrated in greater detail by the following examples and comparative examples.

EXAMPLE 1

Using a cutting insert made of a cemented carbide with a composition of JIS standard P 30 (specifically, WC-20 wt % TiC-10 wt % Co) and a form of JIS SNG 432 as a substrate, the surface thereof was coated with each of coating layers as shown in the following Table 2 by an ion plating method using vacuum arc discharge, as described below, to obtain a sample of a coated cutting tool of the present invention.

Namely, an Al target and Ti target were arranged to face with each other in a film making apparatus, in which the above described cutting inserts as substrates were respectively fit on two points on the diameter passing the center of a ring-shaped substrate supporting means rotatory around the intermediate point, as a center, between both the targets. Under the state, while revolving the cutting inserts at 20 rpm, the inserts were then maintained in an Ar gas atmosphere with a vacuum degree of $1 \times 10^{-1}$ torr, rinsed by applying a voltage of $-2000$ V and heated at 500° C., after which the Ar gas was exhausted. Then, while continuously revolving the cutting inserts and introducing one or both of $N_2$ gas and $CH_4$ gas at a rate of 300 cc/min into the film making apparatus, the Ti target and Al target were evaporated and ionized by vacuum arc discharge, whereby TiN layers and Al layers were alternately laminated on each of the cutting inserts in such a manner that TiN be coated when the cutting insert passing near the Ti target and AlN be coated when the cutting insert passing near the Al target. During the same time, the thickness of the TiN layers and AlN layers laminated was controlled by controlling the quantity of the arc current and the whole coating layer thickness was controlled by the film making time.

For comparison, the surface of a cutting insert with the same composition and same form as described above was coated with the coating layers of carbide, nitride or carbonitride of Ti by an ion plating method using the same film-making apparatus and vacuum arc discharge as described above, thereby obtaining samples of surface-coated cutting inserts of the prior art as shown in Table 2. In addition, samples of coated cutting inserts were prepared by the ordinary method, in which coating layers of TiC, $Al_2O_3$, etc. shown in Table 2 were formed on the surface of the cutting insert with the same composition and same form.

Each of the samples of the surface-coated cutting inserts prepared as described above was subjected to a continuous cutting test and intermittent cutting test under conditions as shown in Table I to measure the flank wear width of the edge, thus obtaining resuts as shown in Table 2.

TABLE 1

|  | Continuous Cutting Test | Intermittent Cutting Test |
| --- | --- | --- |
| Workpiece | SCH 435 | SCM 435 |
| Cutting Speed | 220 m/min | 220 m/min |
| Feed | 0.37 mm/rev | 0.30 mm/rev |
| Cutting Depth | 2.0 mm | 1.5 mm |
| Cutting Time | 15 min | 20 min |

TABLE 2

| Sample No. | Coating Method | Coating layer | | | | | | Continuous Cutting Flank Wear Width (mm) | Intermittent Cutting Flank Wear Width (mm) |
| --- | --- | --- | --- | --- | --- | --- | --- | --- | --- |
|  |  | First Layer | | Second Layer | | Third Layer | | | |
|  |  | Composition | Thickness (μm) | Composition | Thickness (μm) | Composition | Thickness (μm) | | |
| Present Invention | | | | | | | | | |
| 1 | PVD | Coating layers composed of 350 layers consisting of TiN layers with thickness of 0.01 μm and AlN layers with thickness of 0.01 μm laminated with each other to give total thickness of 3.5 μm | | | | | | 0.110 | 0.110 |
| 2 | PVD | Coating layers composed of 10 layers consisting of TiN layers with thickness of 0.15 μm and AlN layers with thickness of 0.15 μm, laminated with each other to give total thickness of 1.5 μm | | | | | | 0.120 | 0.130 |
| Prior Art | | | | | | | | | |
| 1 | PVD | TiN | 1 | TiCN | 2 | TiN | 1 | 0.300 | 0.210 |
| 2 | PVD | TiN | 1 | TiCN | 1 | TiC | 2 | 0.205 | 0.180 |
| 3 | PVD | — | | — | | TiN | 4 | 0.410 | 0.250 |
| 4 | CVD | — | | TiC | 3 | TiN | 2 | 0.205 | broken |
| 5 | CVD | TiN | 2 | $Al_2O_3$ | 1 | TiN | 0.5 | 0.110 | broken |

It is apparent from the above described results that the samples of the coated cutting inserts of the present invention have both an excellent wear resistance and breakage resistance, i.e. more excellent cutting performance than the comaprative samples in both the continuous cutting and intermittent cutting tests.

EXAMPLE 2

Using a cutting insert made of a cemented carbide with a composition of JIS standard P 30 (specifically, WC-20 wt % TiC-10 wt % Co) and a form of JIS SNG 432 as a substrate, the surface thereof was coated with each of coating layers as shown in the following Table 3 by an ion plating method using vacuum arc discharge, as described below, to obtain a sample of a coated cutting tool of the present invention (Sample Nos. 3 to 6).

Namely, an Al target and Zr target were arranged to face with each other in a film making apparatus, in which the above described cutting inserts as substrates were respectively fit on a substrate supporting means rotatory around the intermediate point, as a center, between both the targets, after which the revolving speed of the substrate supporting means was controlled so that the the cutting inserts be revolved at 20 rpm. Thereafter, the inserts were then mainitained in an Ar gas atmosphere with a vacuum degree of $1 \times 10^{-2}$ torr, rinsed by applying a voltage of $-2000$ V and heated at 500° C., after which the Ar gas was exhausted. Then, while introducing one or both of $N_2$ gas and $CH_4$ gas at a rate of 300 cc/min into the film making apparatus, the Zr target and Al target were evaporated and ionized by vacuum arc discharge, whereby the coating layers were alternately laminated on each of the revolving cutting inserts in such a manner that Zr carbide, nitride or carbonitride are coated when the revolving cutting insert passing near the Zr target and Al carbide, nitride or carbonitride are coated when passing near the Al target. During the same time, the thickness of the each layer of carbides, nitrides, carbonitrides of Zr or Al alternately formed was controlled by controlling the quantity of the electron beam irradiated and the whole coating layer thickness was controlled by the film making time.

TABLE 3

| Sample No. | Coating Method | Composition and Thickness of Hard Coating Layer ($\mu$m) |
|---|---|---|
| | | Boundary Layer — Intermediate Layer — Surface Layer |
| 3 | PVD | About 350 layers (total thickness: 3.3 $\mu$m) of ZrN and AlN layers alternately laminated, each having a thickness of 0.01 $\mu$m |
| 4 | PVD | About 400 layers (total thickness: 3.8 $\mu$m) of ZrC and AlC layers alternately laminated, each having a thickness of 0.01 $\mu$m |
| 5 | PVD | About 350 layers (total thickness: 3.5 $\mu$m) of ZrN and AlCN layers alternately laminated, each having a thickness of 0.01 $\mu$m |
| 6 | PVD | About 400 layers (total thickness: 3.7 $\mu$m) of ZrN and AlCN layers alternately laminated, each having a thickness of 0.01 $\mu$m |

Each of the samples of the surface-coated cutting inserts prepared as described above was subjected to a continuous cutting test and intermittent cutting test under conditions as shown in Table 1 to measure the flank wear width of the edge, thus obtaining resuts as shown in Table 4.

TABLE 4

| Sample No. | Flank Wear Width (mm) | |
|---|---|---|
| | Continuous Cutting | Intermittent Cutting |
| 3 | 0.105 | 0.108 |
| 4 | 0.100 | 0.105 |
| 5 | 0.103 | 0.107 |
| 6 | 0.101 | 0.105 |

It is apparent from the above described results that of the samples of the surface-coated cutting inserts of the prior art, Sample Nos. 1-3 whose hard coating layers were formed by the PVD method were inferior in wear resistance and Sample Nos. 4 and 5 whose hard layers were formed by the CVD method exhibited lowering of the breakage resistance due to deterioration of the toughness of the substrate, while Sample Nos. 3-6 of the surface-coated cutting inserts according to the present invention showed more excellent wear resistance in both the continuous cutting and intermittent cutting tests and since the hard coating layer was formed by the PVD method, the toughness of the substrate was maintained resulting in more excellent breakage resistance.

The alternately laminated layers in the present invention can be of any combinations of only carbides, nitrides or carbonitrides such as ZrN and AlN shown in Example, of nitrides and carbonitrides such as ZrN and AlCN and the like, and furthermore, in each layer of Zr systems and Al systems, for example, the components can be suitably changed among the carbide, nitride and carbonitride during the lamination.

EXAMPLE 3

Using a cutting insert made of a cemented carbide with a composition of JIS standard P 30 (specifically, WC-20 wt % TiC-10 wt % Co) and a form of JIS SNG 432 as a substrate, the surface thereof was coated with each of coating layers as shown in the following Table 5 by an ion plating method using vacuum arc discharge, as described below, to obtain a sample of a coated cutting tool of the present invention (Sample Nos. 7 to 10).

Namely, an Al target and Hf target were arranged to face with each other in a film making apparatus, in which the above described cutting inserts as substrates were respectively fit on a substrate supporting means rotating around the intermediate point, as a center, between both the targets, after which the revolving speed of the substrate supporting means was controlled so that the the cutting inserts be revolved at 20 rpm. Thereafter, the inserts were then maintained in an Ar gas atmosphere with a vacuum degree of $1 \times 10^{-2}$ torr, rinsed by applying a voltage of $-2000$ V and heated at 500 ° C., after which the Ar gas was exhausted. Then, while introducing one or both of $N_2$ gas and $CH_4$ gas at a rate of 300 cc/min into the film making apparatus, the Hf target and Al target were evaporated and ionized by vacuum arc discharge, whereby the coating layers were alternately laminated on each of the revolving cutting inserts in such a manner that Hf carbide, nitride or carbonitride are coated when the revolving cutting insert passing near the Hf target and Al carbide, nitride or carbonitride are coated when passing near the Al target. During the same time, the thickness of the each layer of carbides, nitrides, carbonitrides of Hf or Al alternately formed was controlled by controlling the quantity of the electron beam irradiated and the whole coating layer thickness was controlled by the film making time.

TABLE 5

| Sample No. | Coating Method | Composition and Thickness of Hard Coating Layer ($\mu$m) |
|---|---|---|
| | | Boundary Layer — Intermediate Layer — Surface Layer |
| 7 | PVD | About 350 layers (total thickness: 3.5 $\mu$m) of HfN and AlN layers alternately laminated, each having a thickness of 0.01 $\mu$m |
| 8 | PVD | About 400 layers (total thickness: 3.8 $\mu$m) of HfC and AlC layers alternately laminated, each having a thickness of 0.01 $\mu$m |
| 9 | PVD | About 400 layers (total thickness: 3.9 $\mu$m) of HfCN and AlCN layers alternately laminated, each having a thickness of 0.01 $\mu$m |
| 10 | PVD | About 350 layers (total thickness: 3.6 $\mu$m) of HfCN and AlN layers alternately laminated, |

TABLE 5-continued

| Sample No. | Coating Method | Composition and Thickness of Hard Coating Layer (μm) | | |
|---|---|---|---|---|
| | | Boundary Layer | Intermediate Layer | Surface Layer |
| | | each having a thickness of 0.01 μm | | |

Each of the samples of the surface-coated cutting inserts prepared as described above was subjected to a continuous cutting test and intermittent cutting test under conditions as shown in Table 1 to measure the flank wear width of the edge, thus obtaining resuts as shown in Table 6.

TABLE 6

| Sample No. | Flank Wear Width (mm) | |
|---|---|---|
| | Continuous Cutting | Intermittent Cutting |
| 7 | 0.105 | 0.105 |
| 8 | 0.104 | 0.105 |
| 9 | 0.103 | 0.103 |
| 10 | 0.103 | 0.104 |

It is apparent from the above described results that of the samples of the surface-coated cutting inserts of the prior art, Comparative Sample Nos. 1-3 whose hard coating layers were formed by the PVD method were inferior in wear resistance and Comparative Sample Nos. 4 and 5 whose hard layers were formed by the CVD method exhibited lowering of the breakage resistance due to deterioration of the toughness of the substrate, while Sample Nos. 7-10 of the surface-coated cutting inserts according to the present invention showed more excellent wear resistance in both the continuous cutting and intermittent cutting tests and since the hard coating layer was formed by the PVD method, the toughness of the substrate was maintained resulting in more excellent breakage resistance.

The alternately laminated layers in the present invention can be of any combinations of only carbides, nitrides or carbonitrides such as HfN and AlN shown in Example, of nitrides and carbonitrides such as HfN and AlCN and the like, and furthermore, in each layer of Hf systems and Al systems, for example, the components can be suitable changed among the carbide, nitride and carbonitride during the lamination.

UTILITY AND POSSIBILITY ON COMMERCIAL SCALE

According to the present invention, there can be provided a surface-coated hard material for a cutting tool or wear resistance tool having more excellent wear resistance than that of the prior art with maintaining the substrate strength of the cutting tool or wear resistance tool, in particular, being capable of maintaining good cutting performances, as a cutting tool or wear resistance tool, for a long period of time even in the high speed cutting.

We claim:

1. A surface-coated hard material for a cutting tool or wear resistance tool, characterized in that a layer consisting of a carbide, nitride or carbonitride of Ti, Zr or Hf and a layer consisting of a carbide, nitride or carbonitride of Al are alternately laminated to form at least 10 hard coating layers, each layer having a thickness of 0.01 to 0.2 μm and the total layer thickness being 0.5 to 10 μm, on the surface of a substrate of a cutting tool or wear resistance tool.

* * * * *